United States Patent
Jeong

(10) Patent No.: US 8,471,286 B2
(45) Date of Patent: Jun. 25, 2013

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 19 days.

(21) Appl. No.: 13/177,406

(22) Filed: Jul. 6, 2011

(65) Prior Publication Data

US 2011/0260207 A1    Oct. 27, 2011

Related U.S. Application Data

(63) Continuation of application No. 12/606,590, filed on Oct. 27, 2009, now abandoned.

(30) Foreign Application Priority Data

Oct. 27, 2008 (KR) .......... 10-2008-0105258

(51) Int. Cl.
*H01L 33/00* (2010.01)
*H01L 33/38* (2010.01)

(52) U.S. Cl.
USPC .. 257/98; 257/99; 257/E33.065; 257/E33.068

(58) Field of Classification Search
USPC .......................................................... 257/99
See application file for complete search history.

(56) References Cited

U.S. PATENT DOCUMENTS

| | | |
|---|---|---|
| 2005/0133811 A1 | 6/2005 | Han et al. |
| 2007/0114552 A1 | 5/2007 | Jang et al. |
| 2007/0295952 A1 | 12/2007 | Jang et al. |
| 2008/0023691 A1 | 1/2008 | Jang et al. |
| 2008/0113462 A1 | 5/2008 | Kim et al. |
| 2008/0142809 A1 | 6/2008 | Jang et al. |
| 2008/0210955 A1* | 9/2008 | Uemura et al. ............. 257/88 |

FOREIGN PATENT DOCUMENTS

| | | |
|---|---|---|
| EP | 1821348 A2 | 8/2007 |
| KR | 10-2006-0125079 A | 12/2006 |
| KR | 10-2007-0044099 A | 4/2007 |
| KR | 10-2007-0073042 A | 7/2007 |
| KR | 10-2007-0079956 A | 8/2007 |
| KR | 2007-0079957 A | 8/2007 |
| KR | 10-2007-0093556 A | 9/2007 |
| KR | 10-0907223 B1 | 7/2009 |
| KR | 10-0907233 B1 | 7/2009 |
| WO | WO 2007/037762 A1 | 4/2007 |
| WO | WO 2007/148866 A1 | 12/2007 |

* cited by examiner

*Primary Examiner* — Ha Tran T Nguyen
*Assistant Examiner* — Raj R Gupta
(74) *Attorney, Agent, or Firm* — Birch, Stewart, Kolasch & Birch, LLP

(57) ABSTRACT

According to an embodiment of the present invention, a semiconductor light emitting device includes a light emitting structure including a plurality of compound semiconductor layers, an electrode layer disposed under the light emitting structure, an electrode disposed on the light emitting structure, a conductive support member disposed under the electrode layer, a conductive layer disposed between the light emitting structure and the conductive support member, and an insulating layer disposed between the conductive support member and the light emitting structure, wherein the electrode layer is in contact with a first area of a lower surface of the light emitting structure and the conductive layer is in contact with a second area of the lower surface of the light emitting structure, and wherein the conductive layer includes a different material from the electrode layer.

20 Claims, 5 Drawing Sheets

SEMICONDUCTOR LIGHT EMITTING DEVICE

CROSS-REFERENCE TO RELATED APPLICATIONS

This application is a Continuation of U.S. application Ser. No. 12/606,590 filed Oct. 27, 2009 now abandoned, which claims priority under 35 U.S.C. §119 and 35 U.S.C. §365 to Korean Patent Application No. 10-2008-0105258 filed on Oct. 27, 2008. The entire contents of each of these applications are incorporated herein by reference.

BACKGROUND

The embodiment relates to a semiconductor light emitting device.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED or an LD (laser diode), and studies have been continuously conducted to improve the manufacturing process or light efficiency of the nitride semiconductor.

SUMMARY

The embodiment provides a semiconductor light emitting device capable of separating a chip without performing an isolation etching process.

The embodiment provides a semiconductor light emitting device capable of preventing interlayer short from occurring in an outer wall of a light emitting structure.

An embodiment provides a semiconductor light emitting device comprising: a light emitting structure comprising a plurality of compound semiconductor layers; an electrode layer on the light emitting structure; a conductive support member on the electrode layer; a conductive layer formed along a peripheral portion of an upper surface of the light emitting structure, and an insulating layer on the conductive layer.

An embodiment provides a semiconductor light emitting device comprising: a light emitting structure comprising a first conductive semiconductor layer, an active layer on the first conductive semiconductor layer and a second conductive semiconductor layer on the active layer; an electrode layer comprising a reflective electrode on the second conductive semiconductor layer; a conductive support member on the electrode layer; a conductive layer formed along a peripheral portion of an upper surface of the second conductive semiconductor layer; an insulating layer formed along a peripheral portion of an upper surface of the conductive layer; and an electrode under the first conductive semiconductor layer.

An embodiment provides a semiconductor light emitting device comprising: a light emitting structure comprising a plurality of compound semiconductor layers; an electrode layer on the light emitting structure; a transparent conductive layer formed along a peripheral portion of an upper surface of the light emitting structure; a transparent insulating layer formed along a peripheral portion of an upper surface of the transparent conductive layer; a conductive support member on the electrode layer; and an electrode under the light emitting structure.

According to an embodiment of the present invention, a semiconductor light emitting device includes a light emitting structure including a plurality of compound semiconductor layers, an electrode layer disposed under the light emitting structure, an electrode disposed on the light emitting structure, a conductive support member disposed under the electrode layer, a conductive layer disposed between the light emitting structure and the conductive support member, and an insulating layer disposed between the conductive support member and the light emitting structure, wherein the electrode layer is in contact with a first area of a lower surface of the light emitting structure and the conductive layer is in contact with a second area of the lower surface of the light emitting structure, and wherein the conductive layer includes a different material from the electrode layer.

According to an embodiment of the present invention, a semiconductor light emitting device includes a light emitting structure including a first conductive semiconductor layer, a second conductive semiconductor layer, and an active layer disposed between the first conductive semiconductor layer and the second conductive semiconductor layer, a conductive support member disposed under the second conductive semiconductor layer, an electrode layer including a reflective electrode disposed between the second conductive semiconductor layer and the conductive support member, an insulating layer disposed between the second conductive semiconductor layer and the conductive support member, a conductive layer disposed between the second conductive semiconductor layer and the support member, and an electrode disposed on the first conductive semiconductor layer, wherein the insulating layer is disposed between the conductive layer and the conductive support member.

According to an embodiment of the present invention, a semiconductor light emitting device includes a light emitting structure including a plurality of compound semiconductor layers, a support member disposed under the light emitting structure, an electrode disposed on the light emitting structure, an electrode layer disposed between a lower surface of the light emitting structure and the support member, a conductive layer disposed between of a lower surface of the light emitting structure and the support member, and an insulating layer disposed between the conductive layer and the support member under the light emitting structure, wherein the support member has a thickness thicker than a thickness of the insulating layer.

The details of one or more embodiments are set forth in the accompanying drawings and the description below. Other features will be apparent from the description and drawings, and from the claims.

DETAILED DESCRIPTION OF THE EMBODIMENTS

Figure 1:
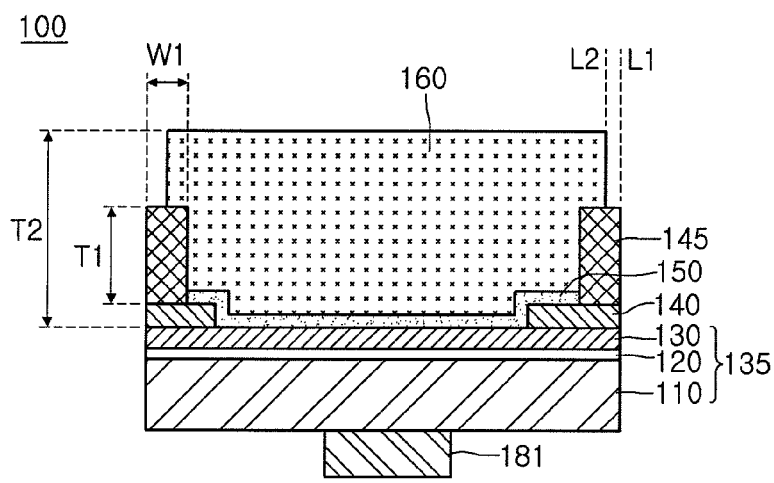
FIG. 1 is a side sectional view showing a semiconductor light emitting device according to an embodiment.

Hereinafter, a semiconductor light emitting device according to an embodiment will be described with reference to the accompanying drawings. In the description of the embodiment, the term "on" or "under" of each layer will be described with reference to the accompanying drawings and thickness of each layer is not limited to thickness shown in the drawings.

In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern.

FIG. 1 is a side sectional view showing a semiconductor light emitting device according to an embodiment.

Referring to FIG. 1, the semiconductor light emitting device 100 comprises a light emitting structure 135, an electrode 181, a conductive layer 140, an insulating layer 145, an electrode layer 150 and a conductive support member 160.

The semiconductor light emitting device 100 comprises a compound semiconductor, e.g., an LED (light emitting diode) based on III-V group compound semiconductors, and the LED may comprise a color LED emitting blue light, green light or red light or an UV (ultra violet) LED. The light emitted from the LED may be variously realized within the technical scope of the embodiment.

The light emitting structure 135 comprises a first conductive semiconductor layer 110, an active layer 120 and a second conductive semiconductor layer 130.

The first conductive semiconductor layer 110 may comprise one selected from the group consisting of GaN, AlN, AlGaN, InGaN, InN, InAlGaN, AlInN, AlGaAs, GaP, GaAs, GaAsP and AlGaInP, which are compound semiconductors of III-V group elements doped with a first conductive dopant. When the first conductive semiconductor layer 110 is an N type semiconductor layer, the first conductive dopant comprises an N type dopant such as Si, Ge, Sn, Se or Te. The first conductive semiconductor layer 110 may have a single layer or a multilayer. However, the embodiment is not limited thereto.

An electrode 181 is formed under the first conductive semiconductor layer 110, and can be provided in a predetermined pattern. The first conductive semiconductor layer 110 may be provided on a lower surface thereof with a roughness pattern.

The active layer 120 is formed on the first conductive semiconductor layer 110 and may have a single quantum well structure or a multi-quantum well structure. The active layer 120 may have a period of a well layer and a barrier layer using compound semiconductor materials of the III-V group elements. For example, the active layer 120 may have a period of an InGaN well layer and a GaN barrier layer. A conductive clad layer may be formed on and/or under the active layer 12, and may comprise an GaN-based layer.

The second conductive semiconductor layer 130 is formed on the active layer 120, and may comprise one selected from the group consisting of GaN, AlN, AlGaN, InGaN, InN, InAlGaN, AlInN, AlGaAs, GaP, GaAs, GaAsP and AlGaInP, which are the compound semiconductors of III-V group elements doped with a second conductive dopant. When the second conductive semiconductor layer 120 is a P type semiconductor layer, the second conductive dopant comprises a P type dopant such as Mg and Zn. The second conductive semiconductor layer 120 may have a single layer or a multilayer. However, the embodiment is not limited thereto.

The light emitting structure 135 may comprise an N type semiconductor layer or a p type semiconductor layer on the second conductive semiconductor layer 120. Further, the first conductive semiconductor layer 110 may be provided as a P type semiconductor layer and the second conductive semiconductor layer 130 may be provided as an N type semiconductor layer. The light emitting structure 135 may comprise at least one of an N-P junction structure, a P-N junction structure, an N-P-N junction structure and a P-N-P junction structure.

The conductive layer 140 and the electrode layer 150 are formed at circumference of an upper portion of the light emitting structure 135.

The conductive layer 140 and the electrode layer 150 are formed on the second conductive semiconductor layer 130. The conductive layer 140 is formed along the peripheral portion of an upper surface of the second conductive semiconductor layer 130 in the form of a band shape, a ring shape or a frame shape.

The conductive layer 140 may comprise transparent conductive material. For example, the conductive layer 140 may comprise at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO. The conductive layer 140 may have a thickness of about 0.02 μm to about 2 μm, and the thickness of the conductive layer 140 can be modified within the technical scope of the embodiment.

The electrode layer 150 is formed at an inner side of an upper surface of the second conductive semiconductor layer 130 and is used to supply power of a second polarity.

An outer peripheral portion of the electrode layer 150 may be formed on the conductive layer 140. However, the embodiment is not limited thereto.

The electrode layer 150 may comprise at least one of an ohmic contact layer, a reflective layer, and an adhesive layer.

The ohmic contact layer may be formed in the form of a layer or a plurality of patterns. The ohmic contact layer may be comprised at least one of a metal material and an oxide material. The ohmic contact layer may comprise at least one selected from the group consisting of ITO, IZO, IZTO, IAZO, IGZO, IGTO, AZO, ATO, GZO, IrOx, RuOx, RuOx/ITO, Ni/IrOx/Au, Ni/IrOx/Au/ITO, Pt, Ni, Au, Rh and Pd. The ohmic contact layer may have a thickness of about 10 Å to about 1 μm. However, the embodiment is not limited thereto. The reflective layer may be formed at least one of layers and formed of at least one of Ag, Ni, Al, Rh, Pd, Ir, Ru, Mg, Zn, Pt, Au and Hf, and materials consisting of the selective combination of these elements. The adhesive layer ma be formed at least one of layers and formed of at least one of Ti, Au, Sn, Ni, Cr, Ga, In, Bi, Cu, Ag, and Ta, and materials consisting of the selective combination of these elements. The electrode layer 150 may be used as a seed layer for a plating process. The seed layer may be formed at least one of Ti, Cr, Ta, Cr/Au, Cr/Cu, Ti/Au, Ta/Cu, and Ta/Ti/Cu.

The insulating layer 145 is formed along the peripheral portion of an upper surface of the conductive layer 140. The insulating layer 145 may have a band shape, a ring shape or a frame shape. Further, the insulating layer 145 can be continuously formed like a closed loop or can be discontinuously formed. For example, the insulating layer 145 may comprise one selected from the group consisting of $SiO_2$, $Si_3N_4$, $SiO_x$, $SiN_x$, $Al_2O_3$ and $TiO_2$.

For example, the insulating layer 145 may have a thickness T1 or height of about 10 μm to about 100 μm, and may have a width W1 of about 10 μm to about 20 μm. The thickness T1 of the insulating layer 145 is equal to or larger than the thickness of the electrode layer 150 and is smaller than the thickness T2 of the conductive support member 160. The width W1 of the insulating layer 145 is equal to or less than the width of the conductive layer 140.

The insulating layer 145 must have a thickness of at least 10 μm to prevent debris, which is generated from the conductive support member 160 when an abnormal impact is applied to the conductive support member 160 during a laser scribing process, from moving toward an outer wall of the light emitting structure 135. The insulating layer 145 has the width enough to stably maintain the adhesion state of the insulating layer.

The conductive support member 160 is formed on the electrode layer 150. The conductive support member 160 may function as a base substrate of a chip and is used to supply power of a second polarity. The electrode layer 150 and/or the conductive support member 160 can be provided as a layer or a plurality of patterns.

The conductive support member 160 may comprise Cu, Au, Ni, Mo, Cu—W, and carrier wafer such as Si, Ge, GaAs, ZnO, SiC, SiGe, and GaN. The conductive support member 160 may be formed through an electrolytic plating scheme or can be prepared in the form of a sheet. However, the embodiment is not limited thereto. The conductive support member 160 may have the thickness T2 of about 30 μm to about 150 μm. However, the embodiment is not limited thereto.

The insulating layer 145 is disposed along the lower peripheral, portion of the conductive support member 160. The insulating layer 145 may be disposed at both or all sides of the conductive support member 160.

An extension line L1 of an outer surface of the insulating layer 145 and an extension line L2 of an outer surface of the conductive support member 160 can be disposed on the same line or the extension line L1 can be disposed outwardly from the extension line L2.

FIGS. 2 to 9 are sectional views showing the procedure of manufacturing the semiconductor light emitting device according to the embodiment.

Figure 2:
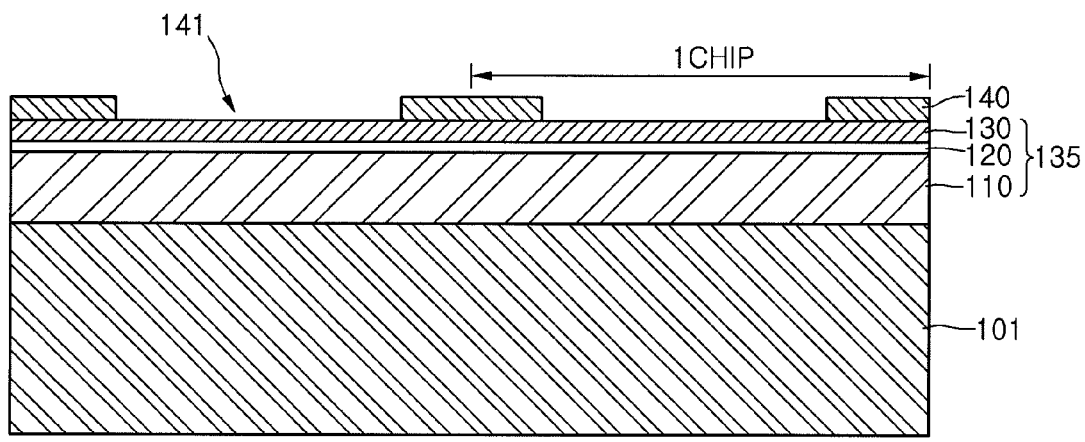
FIGS. 2 to 9 are sectional views showing the procedure of manufacturing a semiconductor light emitting device.

Referring to FIG. 2, a substrate 101 is loaded on growing equipment and a compound semiconductor layer of II to VI group elements is formed on the substrate 101.

The growing equipment may comprise E-beam deposition equipment, physical vapor deposition (PVD) equipment, chemical vapor deposition (CVD) equipment, plasma laser deposition (PLD) equipment, a dual-type thermal evaporator, sputtering equipment and metal organic chemical vapor deposition (MOCVD) equipment. However, the embodiment is not limited thereto.

The substrate 101 may comprise one selected from the group consisting of sapphire ($Al_2O_3$), GaN, SiC, ZnO, Si, GaP, InP, $Ga_2O_3$, a conductive substrate and GaAs. The substrate 101 may be provided thereof with a concave-convex pattern. Further, a layer or a pattern using compound semiconductor of II to VI group elements may be formed on the substrate 101. For example, at least one of a ZnO layer (not shown), a buffer layer (not shown) and an undoped semiconductor layer (not shown) may be formed on the substrate 101. The buffer layer and the undoped semiconductor layer may comprise the compound semiconductors of the III-V group elements. The buffer layer reduces a lattice constant difference from the substrate 101, and the undoped semiconductor layer may comprise an undoped GaN-based semiconductor layer.

The light emitting structure 135 comprising the compound semiconductor layers is formed on the substrate 101. The first conductive semiconductor layer 110 is formed on the substrate 101, the active layer 120 is formed on the first conductive semiconductor layer 110, and the second conductive semiconductor layer 130 is formed on the active layer 120.

The first conductive semiconductor layer 110 may comprise one selected from the group consisting of GaN, AlN, AlGaN, InGaN, InN, InAlGaN, AlInN, AlGaAs, GaP, GaAs, GaAsP and AlGaInP, which are compound semiconductors of III-V group elements doped with the first conductive dopant.

When the first conductive semiconductor layer 110 is the N type semiconductor layer, the first conductive dopant comprises the N type dopant such as Si, Ge, Sn, Se or Te. The first conductive semiconductor layer 110 may have the single layer or the multilayer. However, the embodiment is not limited thereto.

The active layer 120 is formed on the first conductive semiconductor layer 110 and may have the single quantum well structure or the multi-quantum well structure. The active layer 120 may have an arrangement of the well layer and the barrier layer using the compound semiconductor materials of the III-V group elements. For example, the active layer 120 may have an arrangement of the InGaN well layer and the GaN barrier layer.

The conductive clad layer may be formed on and/or under the active layer 12, and may comprise the GaN-based layer.

The second conductive semiconductor layer 130 is formed on the active layer 120, and may comprise one selected from the group consisting of GaN, AlN, AlGaN, InGaN, InN, InAlGaN, AlInN, AlGaAs, GaP, GaAs, GaAsP and AlGaInP, which are the compound semiconductors of the III-V group elements doped with the second conductive dopant. When the second conductive semiconductor layer 120 is the P type semiconductor layer, the second conductive dopant comprises the P type dopant such as Mg and Zn. The second conductive semiconductor layer 120 may have the single layer or the multilayer. However, the embodiment is not limited thereto.

The first conductive semiconductor layer 110, the active layer 120, and the second conductive semiconductor layer 130 can be defined as the light emitting structure 135. A third conductive semiconductor layer, e.g., an N type semiconductor layer or a p type semiconductor layer, may be formed on the second conductive semiconductor layer 130. The light emitting structure 135 may comprise at least one of the N-P junction structure, the P-N junction structure, the N-P-N junction structure and the P-N-P junction structure.

Referring to FIG. 2, the conductive layer 140 may be formed on the second conductive semiconductor layer 130 or the third conductive semiconductor layer. In detail, the conductive layer 140 is disposed along the peripheral portion of the upper surface of the second conductive semiconductor layer 130. The conductive layer 140 having a band shape, a ring shape or a frame shape may be formed along the peripheral surface of an inner area 141 of each chip on the second conductive semiconductor layer 130. The conductive layer 140 can be continuously formed or can be prepared in the shape of a closed loop.

The conductive layer 140 may comprise the transparent conductive material. For example, the conductive layer 140 may comprise at least one selected from the group consisting of ITO, IZO, IZTO, IAZO, IGZO, IGTO, AZO, ATO, GZO, IrOx, RuOx, RuOx/ITO, Ni/IrOx/Au and Ni/IrOx/Au/ITO.

For example, the conductive layer 140 may have the thickness of about 0.02 μm to about 2 μm. The conductive layer 140 may be used as the seed layer for the plating process.

Figure 3:
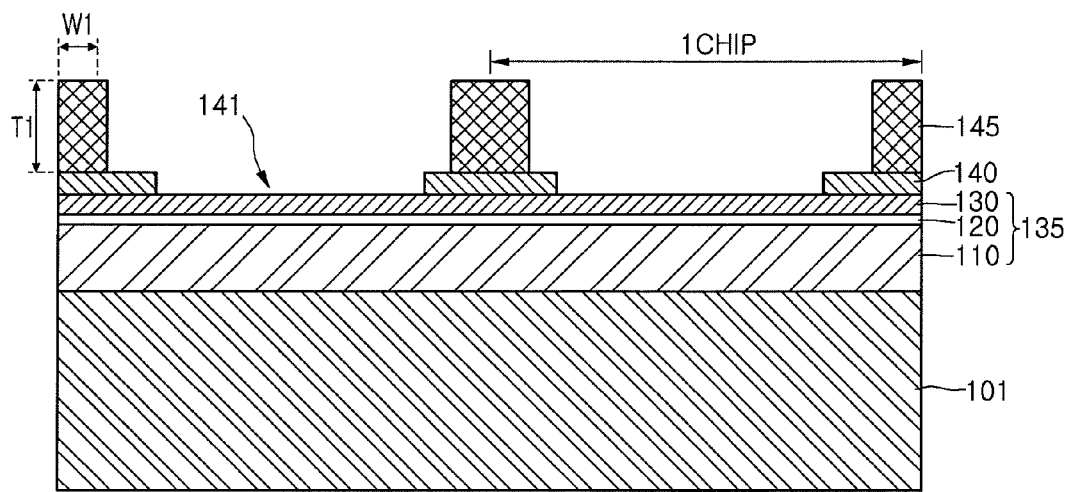

Referring to FIGS. 2 and 3, the insulating layer 145 is formed on the conductive layer 140. The insulating layer 145 is disposed along the peripheral portion of the upper surface of the conductive layer 140 on the basis of an individual chip.

The insulating layer 145 may have a band shape, a ring shape or a frame shape. Further, the insulating layer 145 can be continuously formed like a closed loop or can be discontinuously formed. The insulating layer 145 can be disposed at both or all sides of the conductive layer 140 on the basis of four sides of the chip.

The insulating layer 145 may comprise at least one selected from the group consisting of $SiO_2$, $SiO_3N_4$, $SiO_x$, $SiN_x$, $Al_2O_3$ and $TiO_2$, which are transparent insulating materials. For example, the insulating layer 145 may have the thickness T1 of about 10 μm to about 100 μm, and may have the width W1 of about 10 μm to about 20 μm. The width W1 of the insulating layer 145 is smaller than the width of the conductive layer 140.

Figure 4:
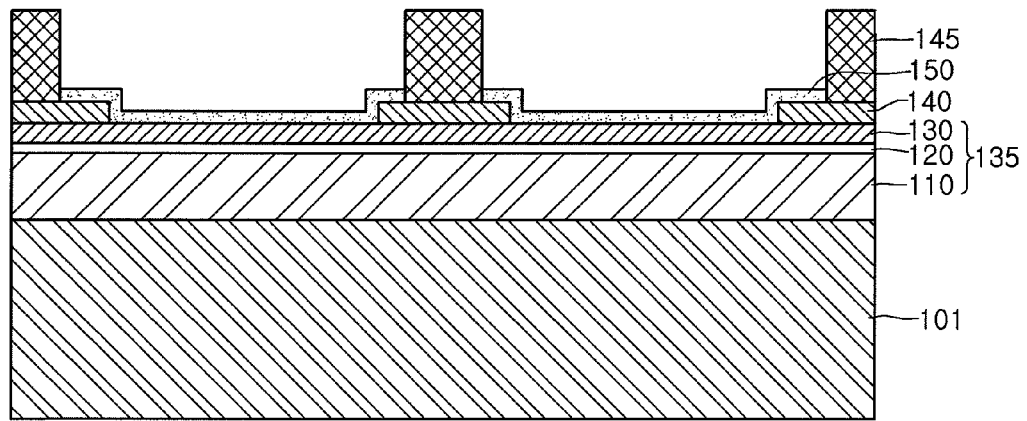

Referring to FIGS. 3 and 4, the electrode layer 150 is formed on the inner side of the upper surface of the second conductive semiconductor layer 130. An outer side of the electrode layer 150 is formed on the upper surface of the conductive layer 140.

The electrode layer 150 may comprise material having ohmic and reflective characteristics and used as a seed layer.

An outer peripheral portion of the electrode layer 150 may be formed on the conductive layer 140. However, the embodiment is not limited thereto. The electrode layer 150 may function as a reflective electrode layer and has a reflectivity of about 50% or more.

The electrode layer 150 may comprise at least one of an ohmic contact layer, a reflective layer, and an adhesive layer.

The ohmic contact layer may be formed in the form of a layer or a plurality of patterns. The ohmic contact layer may be comprised at least one of a metal material and an oxide material. The ohmic contact layer may comprise at least one selected from the group consisting of ITO, IZO, IZTO, IAZO, IGZO, IGTO, AZO, ATO, GZO, IrOx, RuOx, RuOx/ITO, Ni/IrOx/Au, Ni/IrOx/Au/ITO, Pt, Ni, Au, Rh and Pd. The ohmic contact layer may have a thickness of about 10 Å to about 1 μm. However, the embodiment is not limited thereto. The reflective layer may be formed at least one of layers and formed of at least one of Ag, Ni, Al, Rh, Pd, Ir, Ru, Mg, Zn, Pt, Au and Hf, and materials consisting of the selective combination of these elements. The adhesive layer may be formed at least one of layers and formed of at least one of Ti, Au, Sn, Ni, Cr, Ga, In, Bi, Cu, Ag, and Ta, and materials consisting of the selective combination of these elements. The electrode layer 150 may be used as a seed layer for a plating process. The seed layer may be formed at least one of Ti, Cr, Ta, Cr/Au, Cr/Cu, Ti/Au, Ta/Cu, and Ta/Ti/Cu.

The electrode layer 150 may function as a reflective electrode layer and has a reflectivity of about 50% or more.

The electrode layer 150 may have a thickness equal to or less than the thickness of the insulating layer 145.

Figure 5:
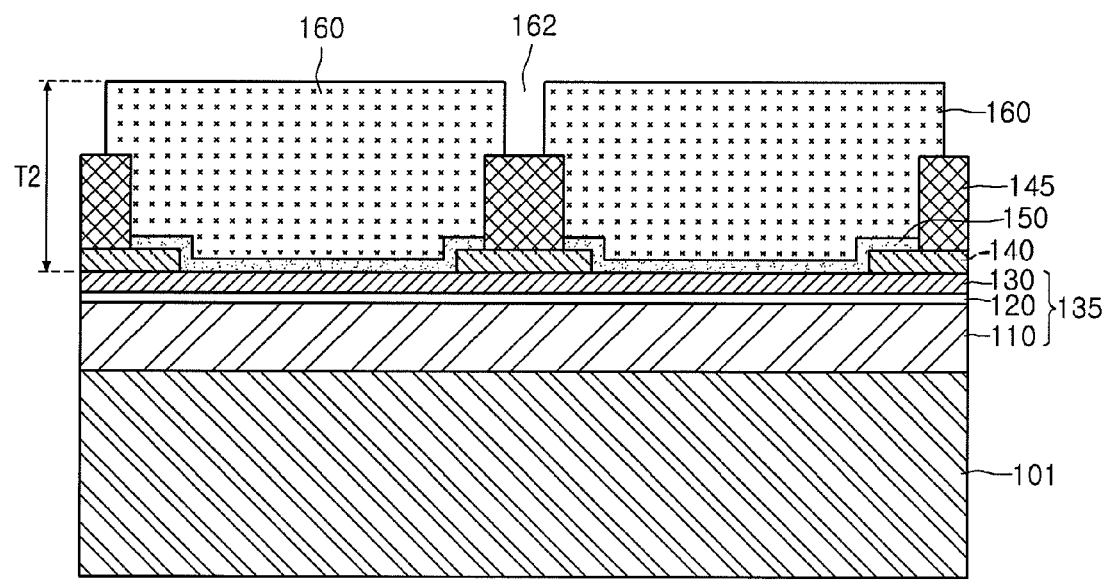

Referring to FIG. 5, the conductive support member 160 is formed on the electrode layer 150. The conductive support member 160 may have the predetermined thickness, e.g., about 30 μm to about 150 μm, and may function as the base substrate of the chip.

The conductive support member 160 may comprise Cu, Au, Ni, Mo, Cu—W, and carrier wafer such as Si, Ge, GaAs, ZnO, SiC, SiGe and GaN. The conductive support member 160 may be formed through the electrolytic plating scheme or can be prepared in the form of the sheet. However, the embodiment is not limited thereto.

The conductive support member 160 may be formed at the inner side of the insulating layer 145, or at the inner side and on the upper surface of the insulating layer 145. That is, the conductive support member 160 may be located at the inner side of the insulating layer 145 or on the insulating layer 145 according to the thickness of the conductive support member 160. However, the embodiment is not limited thereto.

Further, a boundary area 162 between chips may function as a gap at which the conductive support members 160 of adjacent chips are spaced apart from each other. The boundary area 162 can be a channel area. In such a case, the extension line L1 of the outer surface of the insulating layer 145 is located outwardly from the extension line L2 of the outer surface of the conductive support member 160. Further, the conductive support members 160 may be combined with each other.

Figure 6:
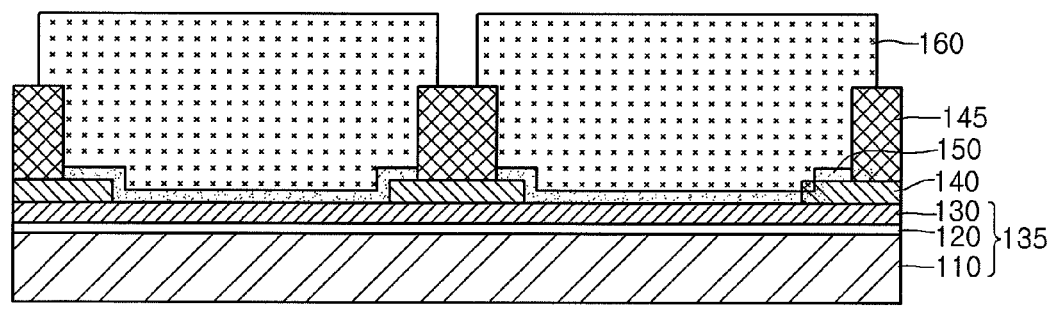

Referring to FIGS. 5 and 6, after the conductive support member 160 is disposed on a base, the substrate 101 is removed. The substrate 101 may be removed using a physical method and/or a chemical method. According to the physical method called laser lift off (LLO), laser having a predetermined wavelength range is irradiated onto the substrate 101, so the substrate 101 is separated from the first conductive semiconductor layer 110. According to the chemical method, when another semiconductor layer (e.g., a buffer layer) is formed between the substrate 101 and the first conductive semiconductor layer 110, the buffer layer is removed using wet etch solution, so the substrate 101 is separated from the first conductive semiconductor layer 110.

Figure 7:
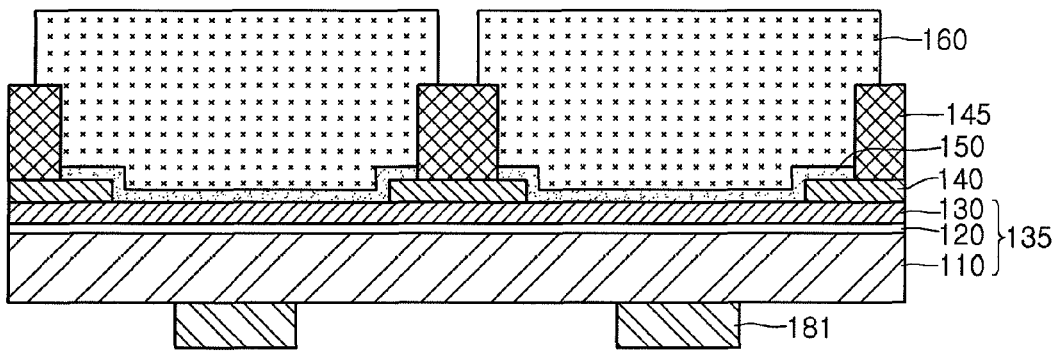

Referring to FIG. 7, the electrode 181 is formed under the first conductive semiconductor layer 110 of the light emitting structure 135 in a chip unit and is provided as a predetermined pattern. In detail, an electrode formation process is performed without performing an isolation etching process (e.g., ICP) relative to the boundary area (i.e. channel area) between chips of the light emitting structure 135, so that the chip manufacturing process can be improved.

Figure 8:
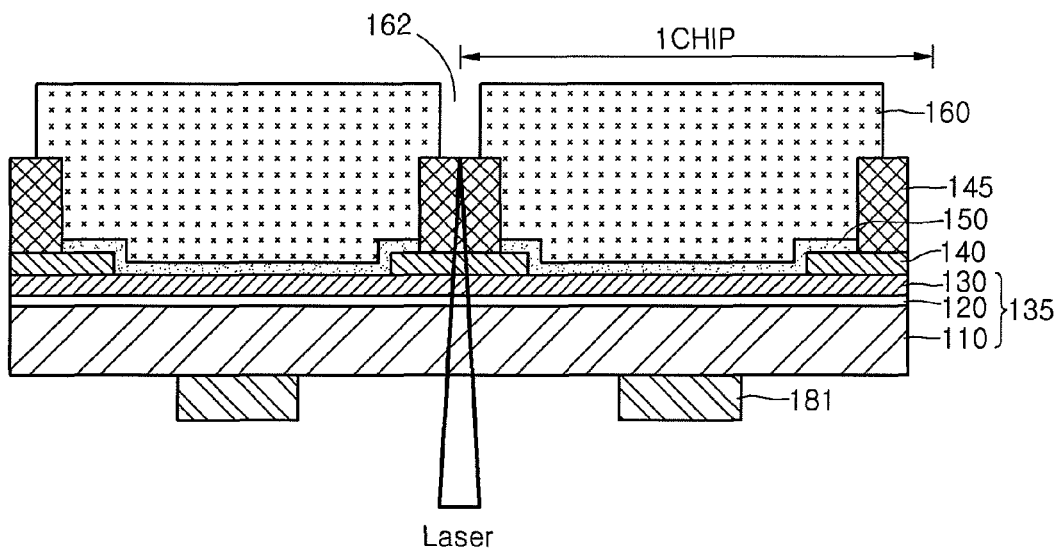
Figure 9:
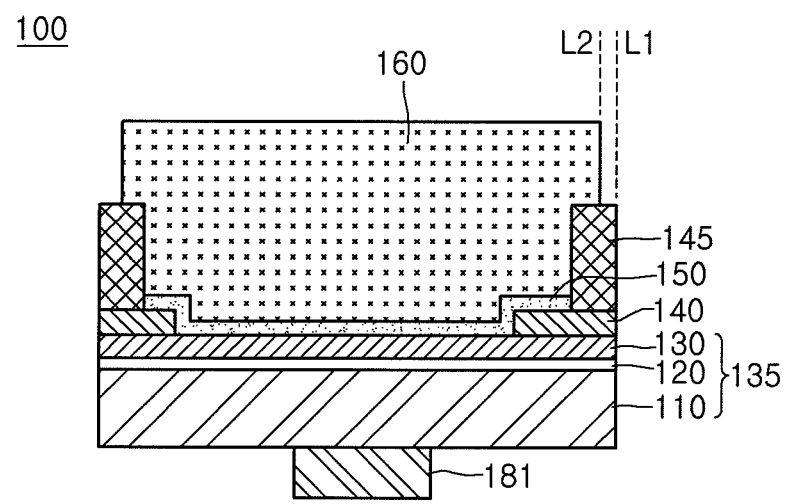

Referring to FIGS. 8 and 9, the semiconductor light emitting device 100 is divided as a chip unit. In detail, laser is irradiated onto the boundary area between the chips using laser scribing equipment, so the chip boundary area is divided. Then, chip separation is performed through a breaking process. Even if the conductive support members 160 have been combined with each other, the conductive support members 160 are broken and separated from each other due to pressing force during the breaking process.

The laser can be irradiated up to the conductive layer 140. Since the conductive layer 140 may be comprises transparent material such as ITO, no debris or fragments are generated when the laser passes through the conductive layer 140, so the interlayer short-circuit can be prevented from occurring in the outer wall of the light emitting structure 135.

When an impact is abnormally applied to the conductive support members 160 during irradiation of the laser, fragments or debris may be generated from the conductive support members 160. The insulating layer 145 can prevent the debris or fragments from moving toward the light emitting structure 135, so that the interlayer short-circuit can be prevented from occurring in the outer wall of the light emitting structure 135.

The insulating layer 145 must have the thickness of at least 10 μm to prevent the debris or fragments, which are generated from the conductive support member 160 when the abnormal impact is applied to the conductive support member 160 during the laser scribing process, from moving toward the outer wall of the light emitting structure 135.

According the laser scribing process and the breaking process, the chips can be separated from each other without applying an impact to the conductive support member 160, so the side surfaces of the conductive support member 160 can be provided in a clean state.

A method for manufacturing a semiconductor light emitting device, the method comprising the steps of: forming a light emitting structure using a compound semiconductor layer on a substrate; forming a conductive layer along a peripheral portion of an upper surface of the light emitting structure; forming a transparent insulating layer on the conductive layer; forming an electrode layer on an inner side of the upper surface of the light emitting structure; forming a conductive support member on the electrode layer; and forming an electrode under the light emitting structure after removing the substrate.

According to the embodiment, no isolation etching or MESA etching process using inductively coupled plasma (ICP) equipment is performed, so the chip manufacturing process can be improved.

According to the embodiment, metal fragments generated from the conductive support member can be prevented from moving toward the outer side of the light emitting structure.

According to the embodiment, the conductive support member is spaced apart from the light emitting structure, so the chip reliability can be improved and the manufacturing process can be simplified.

According to the embodiment, the reliability of a vertical semiconductor light emitting device can be improved.

According to the embodiment, no isolation etching process using the ICP equipment is performed, so the chip manufacturing process can be improved. Further, the side surfaces of the conductive support member are not subject to the laser process, so the debris can be prevented from being generated from the conductive support member.

The embodiment can provide a semiconductor light emitting device such as an LED.

The embodiment can improve electrical reliability of the semiconductor light emitting device.

The embodiment can improve light efficiency of the semiconductor light emitting device.

According to the embodiments, a light source packaged with the semiconductor light emitting device can be employed in the fields of illumination, indication, display and the like.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a light emitting structure including a plurality of compound semiconductor layers;
an electrode layer disposed under the light emitting structure;
an electrode disposed on the light emitting structure;
a conductive support member disposed under the electrode layer;
a conductive layer disposed between the light emitting structure and the conductive support member; and
an insulating layer disposed between the conductive support member and the light emitting structure,
wherein the electrode layer is in contact with a first area of a lower surface of the light emitting structure and the conductive layer is in contact with a second area of the lower surface of the light emitting structure,
wherein the conductive layer includes a material different than a material of the electrode layer,
wherein the conductive layer is located at a peripheral area of the lower surface of the light emitting structure,
wherein the insulating layer is spaced apart from the light emitting structure,
wherein the plurality of compound semiconductor layers includes a first conductive layer, and a second conductive layer disposed between the first conductive semiconductor layer and the electrode layer, and
wherein the conductive layer has an open area between the second conductive semiconductor layer and the conductive support member, the conductive layer formed in a shape of a loop.

2. The semiconductor light emitting device of claim 1, wherein the insulating layer is disposed between an outer portion of the conductive layer and the conductive support member, and
wherein the insulating layer is spaced apart from the lower surface of the light emitting structure.

3. The semiconductor light emitting device of claim 1, wherein a lower surface of the insulating layer is physically in contact with a surface of the conductive support member.

4. The semiconductor light emitting device of claim 1, wherein an outer side of the insulating layer is located outwardly from a side of the conductive support member.

5. The semiconductor light emitting device of claim 1, wherein the insulating layer has a thickness equal to or less than a thickness of the conductive support member.

6. The semiconductor light emitting device of claim 1, wherein the electrode layer comprises at least one of an ohmic contact layer, a reflective layer, and an adhesive layer.

7. The semiconductor light emitting device of claim 1, wherein the conductive layer comprises at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

8. The semiconductor light emitting device of claim 1, wherein an inner portion of the conductive layer is disposed between a lower surface of an outer portion of the electrode layer and the lower surface of the light emitting structure.

9. The semiconductor light emitting device of claim 8, wherein a lower surface of the inner portion of the conductive layer is in contact with an upper surface of the electrode layer.

10. The semiconductor light emitting device of claim 8, wherein the light emitting structure comprises:
an active layer disposed between the first conductive semiconductor layer and the second conductive semiconductor layer.

11. A semiconductor light emitting device comprising:
a light emitting structure including a first conductive semiconductor layer, a second conductive semiconductor layer under the first conductive semiconductor layer, and an active layer disposed between the first conductive semiconductor layer and the second conductive semiconductor layer;
a conductive support member disposed under the second conductive semiconductor layer;
an electrode layer including a reflective electrode disposed between the second conductive semiconductor layer and the conductive support member;
an insulating layer disposed between the second conductive semiconductor layer and the conductive support member;
a conductive layer disposed between the second conductive semiconductor layer and the support member; and an electrode disposed on the first conductive semiconductor layer, wherein the insulating layer is disposed between the conductive layer and the conductive support member, wherein the insulating layer is spaced apart from a lower surface of the light emitting structure, and wherein the conductive layer has an open area between the second conductive semiconductor layer and the conductive support member, the conductive layer formed in a shape of a loop.

12. The semiconductor light emitting device of claim 11, wherein the conductive layer includes a light-transmissive material.

13. The semiconductor light emitting device of claim 11, wherein the conductive layer makes a contact with the electrode layer and the second conductive semiconductor layer.

14. The semiconductor light emitting device of claim 11, wherein the insulating layer is aligned on a plane different from an lower surface of the conductive support member.

15. The semiconductor light emitting device of claim 11, wherein the insulating layer has a thickness of about 10 μm to about 100 μm and has a thickness less than a thickness of the conductive support member.

16. The semiconductor light emitting device of claim 11, wherein the insulating layer has a width of about 10 μm to about 20 μm, and the width of the insulating layer is smaller than a width of the conductive layer.

17. The semiconductor light emitting device of claim 11, wherein the electrode layer contacts at least one side of the insulating layer, and wherein the electrode layer is disposed in the open area of the conductive layer.

18. A semiconductor light emitting device comprising:

a light emitting structure including a plurality of compound semiconductor layers;

a support member disposed under the light emitting structure;

an electrode disposed on the light emitting structure;

an electrode layer disposed between a lower surface of the light emitting structure and the support member;

a conductive layer disposed between of a lower surface of the light emitting structure and the support member; and an insulating layer disposed between the conductive layer and the support member under the light emitting structure, wherein the support member has a thickness thicker than a thickness of the insulating layer, wherein the insulating layer is spaced apart from the lower surface and an outer sidewall of the light emitting structure, and wherein the conductive layer has an open area between the light emitting structure and the support member, the conductive layer formed in a shape of a loop.

19. The semiconductor light emitting device of claim 18, wherein the conductive layer includes a light-transmissive material, and the support member includes a conductive material.

20. The semiconductor light emitting device of claim 18, wherein the conductive layer and the insulating layer are disposed between the light emitting structure and the support member, and wherein the conductive layer is located at an edge area of the lower surface of the light emitting structure which is adjacent to an outer sidewall of the light emitting structure.

* * * * *